(12) United States Patent
Zhu et al.

(10) Patent No.: US 9,733,510 B2
(45) Date of Patent: Aug. 15, 2017

(54) COLOR FILTER DISPLAY SUBSTRATE, DISPLAY PANEL AND METHODS FOR MANUFACTURING THE SAME

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Yawen Zhu, Beijing (CN); Zailong Mo, Beijing (CN); Wei Hu, Beijing (CN); Quanguo Zhou, Beijing (CN); Haoyuan Fan, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 0 days.

(21) Appl. No.: 14/916,298

(22) PCT Filed: Aug. 24, 2015

(86) PCT No.: PCT/CN2015/087884
§ 371 (c)(1),
(2) Date: Mar. 3, 2016

(87) PCT Pub. No.: WO2016/141684
PCT Pub. Date: Sep. 15, 2016

(65) Prior Publication Data
US 2017/0045776 A1  Feb. 16, 2017

(30) Foreign Application Priority Data

Mar. 9, 2015  (CN) .......................... 2015 1 0102403

(51) Int. Cl.
*H01L 27/12* (2006.01)
*G02F 1/1335* (2006.01)
(Continued)

(52) U.S. Cl.
CPC ....... *G02F 1/133514* (2013.01); *G02B 5/201* (2013.01); *G02F 1/1335* (2013.01);
(Continued)

(58) Field of Classification Search
CPC ........... H01L 27/1259; H01L 27/14818; H01L 27/3272
See application file for complete search history.

(56) References Cited

U.S. PATENT DOCUMENTS 6,433,852 B1 * 8/2002 Sonoda ............. G02F 1/134363
349/141
7,365,487 B2 * 4/2008 Matsuura .............. H01L 27/322
313/506

(Continued)

FOREIGN PATENT DOCUMENTS

CN  101281325 A  10/2008
CN  102082061 A  6/2011
(Continued)

OTHER PUBLICATIONS

First Office Action regarding Chinese Application No. 201510102403.1, dated Jan. 25, 2017. Translation provided by Dragon Intellectual Property Law Firm.
(Continued)

*Primary Examiner* — Earl Taylor
(74) *Attorney, Agent, or Firm* — Harness, Dickey & Pierce, P.L.C.

(57) ABSTRACT

The present disclosure provides a color filter display substrate, a method for manufacturing the color filter display substrate, a display panel and a method for manufacturing
(Continued)

the display panel. The color filter display substrate includes: a base substrate; color resin coatings arranged on the base substrate; a black matrix arranged between two of the color resin coatings; and an electric field shielding member arranged on the black matrix and configured to shield an electric field between adjacent pixel units.

20 Claims, 4 Drawing Sheets

(51) Int. Cl.
    *G02B 5/20* (2006.01)
    *G02F 1/1333* (2006.01)
    *G02F 1/1339* (2006.01)
    *G02F 1/1362* (2006.01)
    *G02F 1/1368* (2006.01)

(52) U.S. Cl.
    CPC ........ *G02F 1/1368* (2013.01); *G02F 1/13394* (2013.01); *G02F 1/133308* (2013.01); *G02F 1/133512* (2013.01); *G02F 1/133516* (2013.01); *G02F 1/136209* (2013.01); *H01L 27/124* (2013.01); *H01L 27/1259* (2013.01); *G02F 2001/133334* (2013.01); *G02F 2001/133519* (2013.01)

(56) References Cited

U.S. PATENT DOCUMENTS

| | | | | |
|---|---|---|---|---|
| 8,339,027 B2* | 12/2012 | Liu | ........................ | H01J 29/02 313/309 |
| 8,890,127 B2* | 11/2014 | Yamazaki | ........... | H01L 51/5228 257/40 |
| 8,928,598 B2* | 1/2015 | Cheng | ................... | G06F 3/0412 345/173 |
| 9,244,547 B2* | 1/2016 | Zhou | .................... | G09B 21/004 |
| 9,250,756 B2* | 2/2016 | Kim | ..................... | G06F 3/0412 |
| 9,478,593 B2* | 10/2016 | Yamazaki | ........... | H01L 51/5228 |
| 2005/0110939 A1* | 5/2005 | Wano | .................. | G02F 1/13306 349/178 |
| 2005/0225708 A1* | 10/2005 | Oke | ................... | G02F 1/134363 349/139 |
| 2006/0103789 A1* | 5/2006 | Takahashi | ......... | G02F 1/133512 349/110 |
| 2007/0002264 A1* | 1/2007 | Kim | .................... | G02F 1/13394 349/156 |
| 2008/0273257 A1 | 11/2008 | Ho | | |
| 2009/0059155 A1* | 3/2009 | Nakayama | .......... | G02F 1/13394 349/156 |
| 2009/0104725 A1* | 4/2009 | Paik | .................... | G02F 1/13394 438/30 |
| 2009/0109356 A1* | 4/2009 | Kitagawa | .......... | G02F 1/134363 349/33 |
| 2009/0231497 A1* | 9/2009 | Takahashi | ........... | G02F 1/13338 349/1 |
| 2010/0033448 A1* | 2/2010 | Koito | .................... | G06F 3/0412 345/174 |
| 2010/0085497 A1* | 4/2010 | Chang | .................. | G09G 3/3648 349/37 |
| 2010/0315362 A1* | 12/2010 | Cheng | .................. | G06F 3/0412 345/173 |
| 2011/0176095 A1* | 7/2011 | Fujita | ..................... | B41M 3/003 349/106 |
| 2011/0199564 A1* | 8/2011 | Moriwaki | ......... | G02F 1/136227 349/122 |
| 2011/0228189 A1* | 9/2011 | Oh | ....................... | G02F 1/13338 349/43 |
| 2012/0019748 A1* | 1/2012 | Kim | ..................... | G02F 1/133512 349/106 |
| 2012/0038867 A1* | 2/2012 | Kwon | ................ | G02F 1/133512 349/110 |
| 2012/0113343 A1* | 5/2012 | Konno | .............. | G02F 1/134363 349/39 |
| 2012/0169212 A1* | 7/2012 | Liu | ........................ | H01J 31/127 313/498 |
| 2013/0112955 A1* | 5/2013 | Yamazaki | ........... | H01L 51/5228 257/40 |
| 2013/0147737 A1* | 6/2013 | Zhou | ..................... | G09B 21/004 345/173 |
| 2013/0169901 A1* | 7/2013 | Kim | .................. | H01L 29/78633 349/43 |
| 2014/0036189 A1* | 2/2014 | Yi | ....................... | G02F 1/133512 349/43 |
| 2014/0036210 A1* | 2/2014 | Nakamura | .......... | G02F 1/13392 349/106 |
| 2014/0063419 A1* | 3/2014 | Lo | ..................... | G02F 1/134309 349/106 |
| 2014/0168538 A1* | 6/2014 | Kim | ........................ | G06F 3/044 349/12 |
| 2015/0069374 A1* | 3/2015 | Yamazaki | ........... | H01L 51/5228 257/40 |
| 2015/0098048 A1* | 4/2015 | Tomioka | ........... | G02F 1/134363 349/106 |
| 2015/0131025 A1* | 5/2015 | Ota | .................... | G02F 1/133512 349/58 |
| 2015/0138480 A1* | 5/2015 | Yi | ........................ | G02F 1/13439 349/44 |
| 2015/0301415 A1* | 10/2015 | Sawada | .................. | G11C 19/28 349/147 |
| 2015/0346565 A1* | 12/2015 | Okumoto | .......... | G02F 1/134363 257/72 |
| 2015/0370114 A1* | 12/2015 | Du | ....................... | G02F 1/13338 349/12 |
| 2015/0370116 A1* | 12/2015 | Chae | .................... | G02F 1/13394 349/43 |
| 2016/0187733 A1* | 6/2016 | Xie | .................... | G02F 1/134309 257/88 |
| 2016/0231617 A1* | 8/2016 | Hong | ................ | G02F 1/133514 |

FOREIGN PATENT DOCUMENTS

| | | |
|---|---|---|
| CN | 102253538 A | 11/2011 |
| CN | 103487971 A | 1/2014 |
| CN | 103744222 A | 4/2014 |
| CN | 103777395 A | 5/2014 |
| CN | 203688948 U | 7/2014 |
| CN | 104656305 A | 5/2015 |
| JP | 2013142748 A | 7/2013 |
| KR | 20070068577 A | 7/2007 |
| KR | 20140098401 A * | 8/2014 |
| TW | 201044060 A1 | 12/2010 |

OTHER PUBLICATIONS

International Search Report and Written Opinion of the International Searching Authority for International Application No. PCT/CN2015/087884, filed Aug. 24, 2015, mailed Nov. 18, 2015. English translation provided by Dragon Intellectual Property Law Firm.

\* cited by examiner

COLOR FILTER DISPLAY SUBSTRATE, DISPLAY PANEL AND METHODS FOR MANUFACTURING THE SAME

CROSS REFERENCE OF RELATED APPLICATIONS

This application is the U.S. National Phase of PCT Application No. PCT/CN2015/087884 filed on Aug. 24, 2015, which claims a priority of the Chinese patent application No. 201510102403.1 filed on Mar. 9, 2015, the disclosure of which is incorporated herein by reference in its entirety.

TECHNICAL FIELD

The present disclosure relates to the field of display technology, in particular to a color filter display substrate, a method for manufacturing the color filter display substrate, a display panel, and a method for manufacturing the display panel.

BACKGROUND

FIG. 1 is a sectional view of an existing display panel and FIG. 2 is another sectional view of the existing display panel. A line along which the sectional view of FIG. 1 is formed extends parallel to an extension direction of data lines on an array substrate, and this sectional view shows a Thin Film Transistor (TFT). A line along which the sectional view of FIG. 2 is formed extends parallel to an extension direction of gate lines on the array substrate. The display panel includes a color filter display substrate 101 and the array substrate 102 arranged opposite to each other to form a cell. A liquid crystal layer 103 is arranged between the color filter display substrate 101 and the array substrate 102. Different voltages are applied to adjacent pixel units on the array substrate 102. For example, a high level is applied to the pixel unit 104, while a low level is applied to the pixel unit 105. An electric field 106 generated by the pixel unit 104 may interfere with liquid crystal molecules 107 on the pixel unit 105, and thus a deflection direction of the liquid crystal molecules may be changed. As a result, such a phenomenon as crosscolor will occur.

SUMMARY

An object of the present disclosure is to provide a color filter display substrate, a method for manufacturing the color filter display substrate, a display panel, and a method for manufacturing the display panel, so as to prevent the occurrence of crosscolor caused when the arrangement of the liquid crystal molecules are affected by the electric fields between the adjacent pixel units.

In one aspect, the present disclosure provides in some embodiments a color filter display substrate including: a base substrate; color resin coatings arranged on the base substrate; a black matrix arranged between two of the color resin coatings; and an electric field shielding member arranged on the black matrix and configured to shield an electric field between adjacent pixel units.

Alternatively, a TFT and a data line are arranged on the base substrate, and the electric field shielding member is arranged on the black matrix and at a position corresponding to the data line. Alternatively, the electric field shielding member includes a first spacer and a conductive layer arranged on a surface of the first spacer.

Alternatively, the conductive layer is grounded via a common electrode line.

Alternatively, the first spacer is of a bar shape.

Alternatively, an overcoat is arranged on the black matrix and the color resin coatings, and the first spacer is arranged on the overcoat.

Alternatively, a second spacer is arranged on the overcoat, and the second spacer is a post spacer.

In another aspect, the present disclosure provides in some embodiments a display panel including the above-mentioned color filter display substrate.

Alternatively, the display panel further includes an array substrate on which a data line is arranged, and an electric field shielding member is arranged on a black matrix and at a position corresponding to the data line.

In yet another aspect, the present disclosure provides in some embodiments a method for manufacturing a color filter display substrate, including steps of: forming a black matrix; forming color resin coatings, the black matrix being arranged between two of the color resin coatings; and forming an electric field shielding member on the black matrix, the electric field shielding member being configured to shield an electric field between adjacent pixel units.

Alternatively, a TFT and a data line are formed on the base substrate, and the electric field shielding member is arranged on the black matrix and at a position corresponding to the data line.

Alternatively, the step of forming the electric field shielding member on the black matrix and at a position corresponding to the data line includes: forming a first spacer on the black matrix and at a position corresponding to the data line; and forming a conductive layer on a surface of the first spacer.

Alternatively, prior to the step of forming the first spacer on the black matrix and at the position corresponding to the data line, the method further includes forming an overcoat on the black matrix and the color resin coatings, and the step of forming the first spacer on the black matrix and at the position corresponding to the data line includes forming the first spacer on the overcoat.

Alternatively, the method further includes forming a second spacer on the overcoat while forming the first spacer on the black matrix and at the positions corresponding to the data line, and the second spacer is a post spacer.

In still yet another aspect, the present disclosure provides in some embodiments a method for manufacturing a display panel, including the steps of the above-mentioned method for manufacturing the color filter display substrate.

Alternatively, the display panel further includes an array substrate on which a data line is formed, and a step of forming an electric field shielding member on a black matrix includes forming the electric field shielding member on the black matrix and at a position corresponding to the data line on the array substrate.

According to the color filter display substrate, the method for manufacturing the color filter display substrate, the display panel and the method for manufacturing the display panel in the embodiments of the present disclosure, the electric field shielding member is arranged on the black matrix and at the position corresponding to the data line, so as to shield the electric field between the adjacent pixel units. As a result, it is able to eliminate or weaken the electric field between the adjacent pixel units, thereby to prevent the occurrence of crosscolor. In addition, it is also able to eliminate or reduce fringing-induced charges generated between a signal line at an edge of the display panel and a pixel electrode, thereby to prevent the light leakage at the edge of the display panel.

DETAILED DESCRIPTION

In order to facilitate the understanding of the present disclosure, the present disclosure will be described hereinafter in conjunction with the drawings and embodiments. It should be appreciated that, although the following description is given on the basis of a display panel with a Fringe Field Switching (FFS) mode, the display panel with any other modes, e.g., an In-Plane Switching (IPS) mode, also falls within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too. In addition, the word "on" is merely used to represent that the two members are connected to each other, directly or indirectly.

First Embodiment

Figure 1:
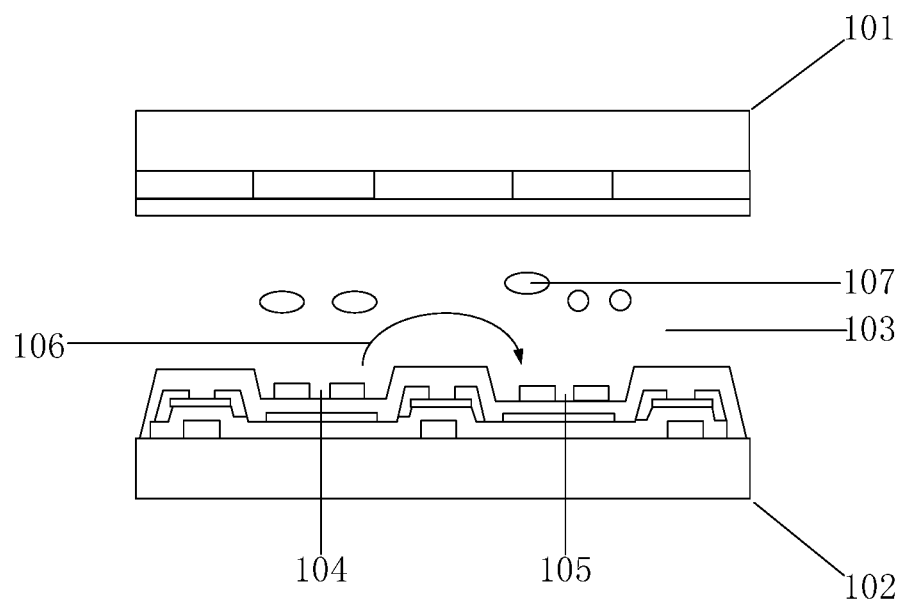
FIG. 1 is a sectional view of an existing display panel.
Figure 2:
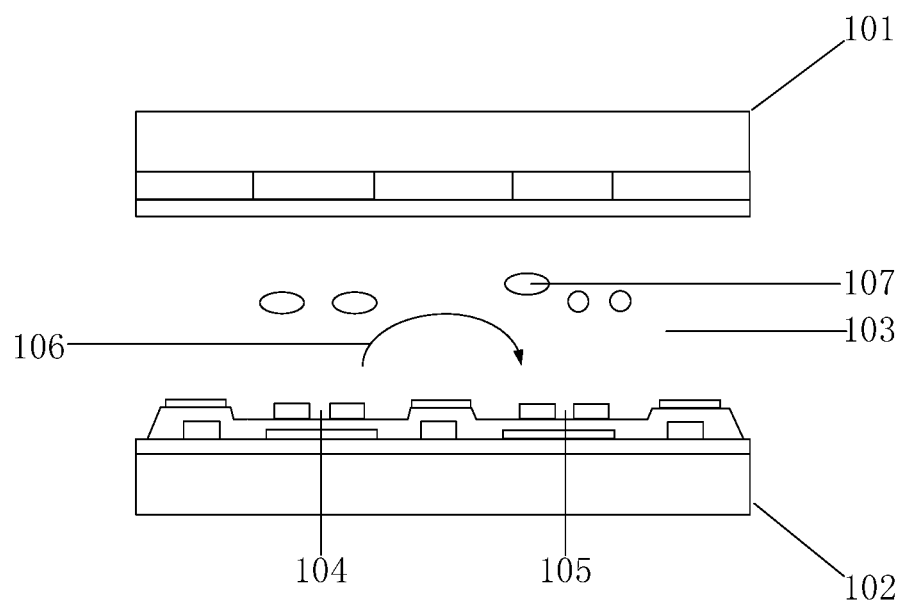
FIG. 2 is another sectional view of the existing display panel in FIG. 1.
Figure 3:
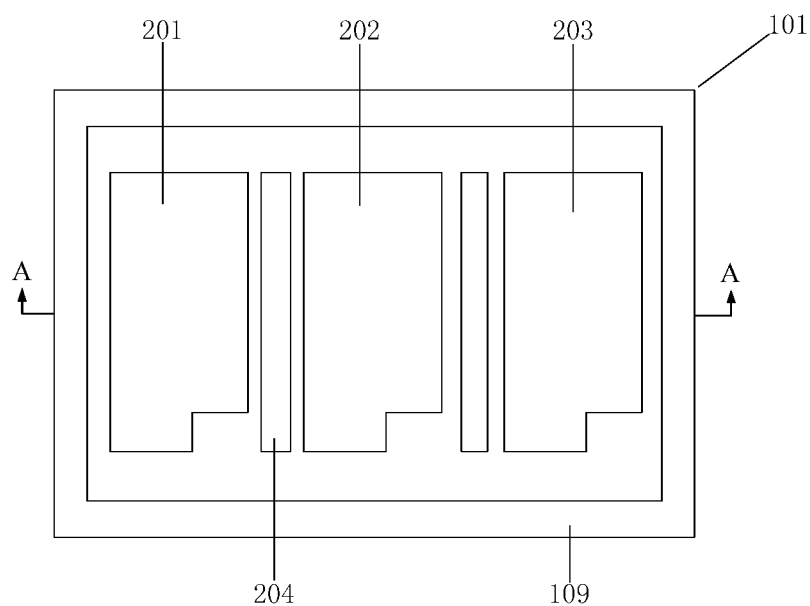
FIG. 3 is a schematic view showing a color filter display substrate according to the first embodiment of the present disclosure.
Figure 4:
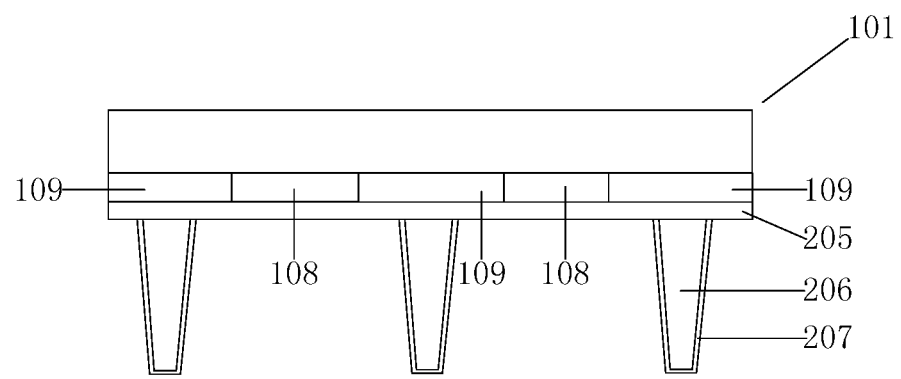
FIG. 4 is a sectional view of the color filter display substrate along line A-A in FIG. 3.

As shown in FIG. 3 which is a schematic view showing a color filter display substrate according to the first embodiment of the present disclosure and FIG. 4 which is a sectional view of the color filter display substrate along line A-A, the color filter display substrate 101 includes: a base substrate; color resin coatings 108 arranged on the base substrate and including red resin coatings 201, green resin coatings 202 and blue resin coatings 203; a black matrix 109 arranged between two of the color resin coatings 108; and an electric field shielding member 204 arranged along a long side of the black matrix 109 and configured to shield an electric field between adjacent pixel units. For example, the electric field shielding member 204 may be arranged at a position corresponding to a data line on the array substrate. For another example, in a Color filter On Array (COA) display panel, the electric field shielding member 204 may be arranged at a position corresponding to the data line. Specifically, the electric field shielding member 204 is arranged along the long side of the black matrix 109, so as to mainly shield the electric field generated between the pixel units corresponding to the resin coatings in different colors. Of course, the electric field shielding member 204 may also be arranged along a short side of the black matrix 109. In this way, it is able to eliminate or weaken the electric field between the adjacent pixel units, thereby to prevent the occurrence of crosscolor. In addition, it is also able to eliminate or reduce fringing-induced charges generated between a signal line at an edge of the display panel and a pixel electrode, thereby to prevent the light leakage at the edge of the display panel.

As shown in FIG. 4, the black matrix 109 and the color resin coatings 108 are coated with an overcoat 205. Alternatively, the overcoat 205 is a planarization layer, on which the electric field shielding member 204 is arranged. Alternatively, the electric field shielding member 204 includes a first spacer 206 and a conductive layer 207 arranged on, e.g., covering, a surface of the first spacer 206. Of course, the conductive layer 207 may be arranged on the overcoat 205. The conductive layer 207 is connected to a common electrode line so as to be grounded.

During the actual implementation, a second spacer (not shown) may also be arranged on the overcoat 205 and at a position corresponding to a TFT on the array substrate. The first spacer is of a bar shape, and the second spacer is a post spacer.

According to the color filter display substrate in the embodiment of the present disclosure, the electric field shielding member is arranged on the black matrix and at the position corresponding to the data line, so as to shield the electric field between the adjacent pixel units. As a result, it is able to eliminate or weaken the electric field between the adjacent pixel units, thereby to prevent the occurrence of crosscolor. In addition, it is also able to eliminate or reduce fringing-induced charges generated between a signal line at an edge of the display panel and a pixel electrode, thereby to prevent the light leakage at the edge of the display panel.

Second Embodiment

Figure 5:
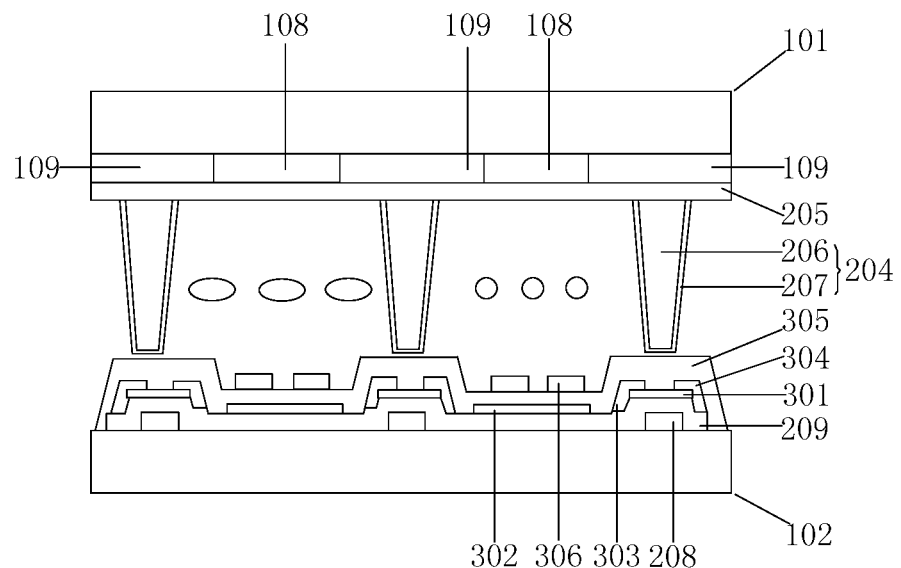
FIG. 5 is a sectional view of a display panel according to the second embodiment of the present disclosure.
Figure 6:
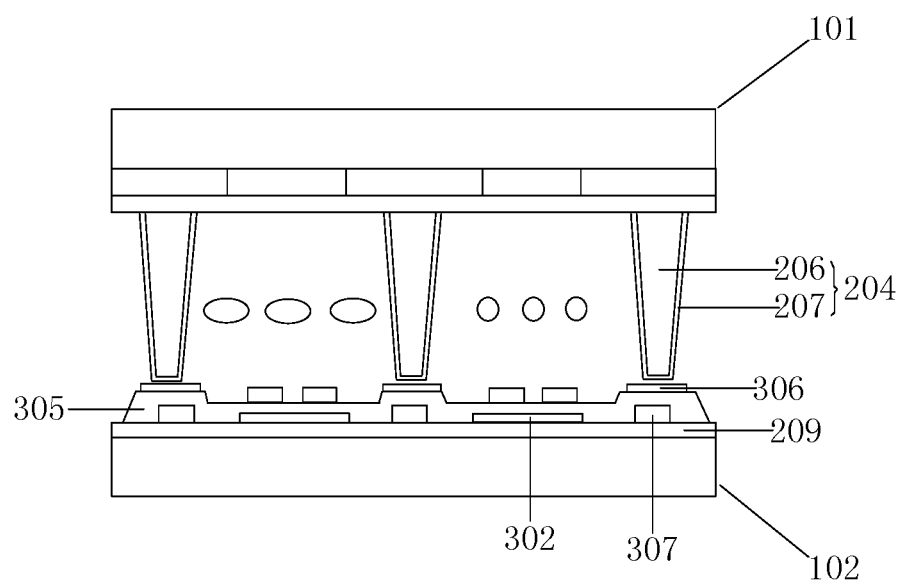
FIG. 6 is another sectional view of the display panel.

FIG. 5 is a sectional view of a display panel according to the second embodiment of the present disclosure; and FIG. 6 is another sectional view of the display panel in FIG. 5. A line along which the sectional view of FIG. 5 is formed extends parallel to the data line on the array substrate, and this sectional view shows the TFT. In additional, a line along which the sectional view of FIG. 6 is formed extends parallel to a gate line on the array substrate. The display panel includes the color filter display substrate 101. For example, the display panel is a liquid crystal display panel, and it includes the array substrate 102 and the color filter display substrate 101. The array substrate 102 includes a base substrate, on which a gate electrode 208, a gate insulating layer 209, an active layer 301, a pixel electrode 302, a source electrode 303, a drain electrode 304, a data line 307, a passivation layer 305 and a common electrode layer 306 are arranged sequentially. The electric field shielding member 204 is arranged on the color filter display substrate and at a position corresponding to one of the data line 307. Alternatively, the color filter display substrate 101 and the array substrate 102 are arranged opposite to each other to form a cell. The display panel further includes a liquid crystal layer arranged between the color filter display substrate 101 and the array substrate 102, an alignment layer for aligning the liquid crystal molecules, and a sealant for adhering the array substrate 102 to the color filter display substrate 101. For another example, in a COA display panel, the electric field shielding member 204 may be arranged at a position corresponding to the data line. The COA display panel includes the color filter display substrate 101 on which an array driving mechanism is arranged. The color filter display substrate 101 and the base substrate are arranged opposite to each other to form a cell, and liquid crystals are arranged therebetween.

The implementation of the color filter display substrate may refer to that mentioned in the first embodiment, and thus will not be repeated herein.

According to the display panel in the embodiment of the present disclosure, the electric field shielding member is arranged on the black matrix and at the position corresponding to the data line, so as to shield the electric field between the adjacent pixel units. As a result, it is able to eliminate or weaken the electric field between the adjacent pixel units, thereby to prevent the occurrence of crosscolor. In addition, it is also able to eliminate or reduce fringing-induced charges generated between a signal line at an edge of the display panel and a pixel electrode, thereby to prevent the light leakage at the edge of the display panel.

Third Embodiment

Figure 7:
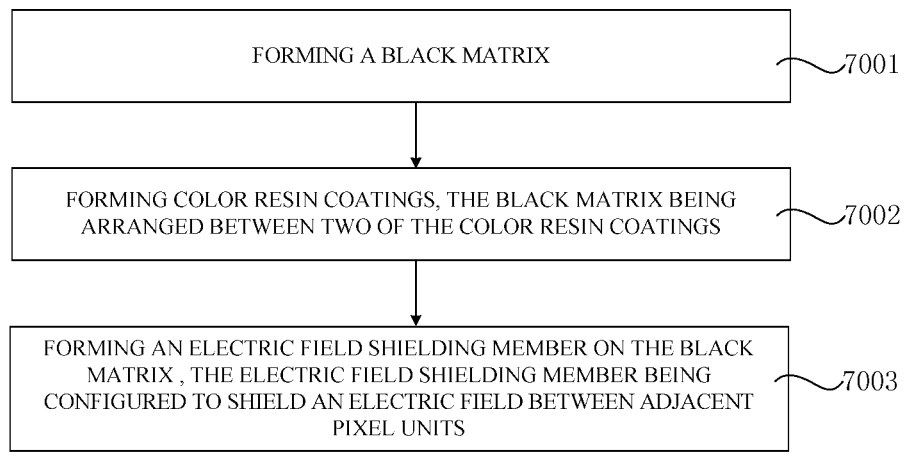
FIG. 7 is a flow chart of a method for manufacturing the color filter display substrate according to the third embodiment of the present disclosure.

FIG. 7 is a flow chart of a method for manufacturing the color filter display substrate according to the third embodiment of the present disclosure. As shown in FIG. 7, the method includes: step 7001 of forming a black matrix; step 7002 of forming color resin coatings, the black matrix being arranged between two of the color resin coatings; and step 7003 of forming an electric field shielding member on the black matrix, the electric field shielding member being configured to shield an electric field between adjacent pixel units.

The above method will be described hereinafter in more details.

As shown in FIGS. 3 and 4, the method includes forming the red resin coatings 201 subsequent to forming the black matrix 109. Subsequent to forming the red resin coatings 201, the green resin coatings 202 are formed. Subsequent to forming the green resin coatings 202, the blue resin coatings 203 are formed. The red resin coatings 201, the green resin coatings 202 and the blue resin coatings 203 are collectively called as the color resin coatings 108. The black matrix 109 is arranged between the color resin coatings 108. Subsequent to forming the blue resin coatings 203, the overcoat 205 is formed on the color resin coatings 108 and the black matrix 109. Alternatively, the overcoat 205 is a planarization layer.

In this embodiment, the electric field shielding member 204 is arranged along a long side of the black matrix and at a position corresponding to the data line on the array substrate, so as to shield the electric field generated between the adjacent pixel units. Specifically, the electric field shielding member 204 is formed along the long side of the black matrix 109, so as to mainly shield the electric field generated between the pixel units corresponding to the resin coatings in different colors. Of course, the electric field shielding member 204 may also be arranged along a short side of the black matrix 109. In this way, it is able to eliminate or weaken the electric field between the adjacent pixel units, thereby to prevent the occurrence of crosscolor. In addition, it is also able to eliminate or reduce fringing-induced charges generated between a signal line at an edge of the display panel and a pixel electrode, thereby to prevent the light leakage at the edge of the display panel.

Alternatively, the electric field shielding member 204 includes the first spacer 206 and the conductive layer 207. For example, the electric field shielding member 204 may be arranged at a position corresponding to the data line on the array substrate in the display panel. The first spacer 206 is formed on the black matrix 109 and at a position corresponding to the data line, and the conductive layer 207 is formed on, e.g., covers, a surface of the first spacer 206. Of course, the conductive layer 207 may be arranged on the overcoat 205. The conductive layer 207 is connected to a common electrode line so as to be grounded. For another example, in a COA display panel, the electric field shielding member 204 may be arranged at a position corresponding to the data line. The first spacer 206 may be arranged on the black matrix 109 and at a position corresponding to the data line, and the conductive layer 207 may be arranged on, e.g., cover, the surface of the first spacer 206. Of course, the conductive layer 207 may be arranged on the overcoat 205. The conductive layer 207 is connected to a common electrode line so as to be grounded. During the actual implementation, a second spacer (not shown) may also be arranged on the overcoat 205 and at a position corresponding to a TFT on the array substrate. The first spacer is of a bar shape, and the second spacer is a post spacer.

According to the method in the embodiment of the present disclosure, the electric field shielding member is arranged on the black matrix and at the position corresponding to the data line, so as to shield the electric field between the adjacent pixel units. As a result, it is able to eliminate or weaken the electric field between the adjacent pixel units, thereby to prevent the occurrence of crosscolor. In addition, it is also able to eliminate or reduce fringing-induced charges generated between a signal line at an edge of the display panel and a pixel electrode, thereby to prevent the light leakage at the edge of the display panel.

Fourth Embodiment

The present disclosure provides in this embodiment a method for manufacturing the display panel, including the steps of the method for manufacturing the color filter display substrate in the third embodiment.

Different from the COA display panel, the display panel in this embodiment further includes an array substrate on which a data line is formed, and a step of forming an electric field shielding member on the black matrix includes forming the electric field shielding member on the black matrix and at a position corresponding to the data line.

According to the method in the embodiment of the present disclosure, the electric field shielding member is arranged on the black matrix and at the position corresponding to the data line, so as to shield the electric field between the adjacent pixel units. As a result, it is able to eliminate or weaken the electric field between the adjacent pixel units, thereby to prevent the occurrence of crosscolor. In addition, it is also able to eliminate or reduce fringing-induced charges generated between a signal line at an edge of the display panel and a pixel electrode, thereby to prevent the light leakage at the edge of the display panel.

The above are merely the preferred embodiments of the present disclosure. It should be appreciated that, a person skilled in the art may make further improvements and modifications without departing from the principle of the present disclosure, and these improvements and modifications shall also fall within the scope of the present disclosure.

What is claimed is:

1. A color filter display substrate, comprising:
   a base substrate;
   color resin coatings arranged on the base substrate;
   a black matrix arranged between two of the color resin coatings; and an electric field shielding member arranged on the black matrix and configured to shield an electric field between adjacent pixel units,
wherein the electric field shielding member comprises a first spacer and a conductive layer arranged on a surface of the first spacer, and the conductive layer is grounded via a common electrode line.

2. The color filter display substrate according to claim 1, wherein a Thin Film Transistor (TFT) and a data line are arranged on the base substrate, and the electric field shielding member is arranged on the black matrix and at a position corresponding to the data line.

3. The color filter display substrate according to claim 1, wherein the first spacer is of a bar shape.

4. The color filter display substrate according to claim 1, wherein an overcoat is arranged on the black matrix and the color resin coatings, and the first spacer is arranged on the overcoat.

5. The color filter display substrate according to claim 4, wherein a second spacer is arranged on the overcoat, and the second spacer is a post spacer.

6. A display panel comprising the color filter display substrate according to claim 1.

7. A display panel comprising the color filter display substrate according to claim 2.

8. The display panel according to claim 6, further comprising an array substrate on which a data line is arranged, wherein an electric field shielding member is arranged on a black matrix and at a position corresponding to the data line.

9. A method for manufacturing a color filter display substrate, comprising steps of:
forming a black matrix;
forming color resin coatings, the black matrix being arranged between two of the color resin coatings; and
forming an electric field shielding member on the black matrix, the electric field shielding member being configured to shield an electric field between adjacent pixel units,
wherein a Thin Film Transistor (TFT) and a data line are formed on a base structure, and the step of forming the electric field shielding member on the black matrix comprises:
forming the electric field shielding member on the black matrix and at a position corresponding to the data line;
the step of forming the electric field shielding member on the matrix and at a position corresponding to the data line comprises:
forming a first spacer on the black matrix and at a position corresponding to the data line; and forming a conductive layer on a surface of the first spacer;
prior to the step of forming the first spacer on the black matrix and at the position corresponding to the data line, the method further comprises:
forming an overcoat on the black matrix and the color resin coatings; and
the step of forming the first spacer on the black matrix and at the position corresponding to the data line comprises forming the first spacer on the overcoat.

10. The method according to claim 9, further comprising forming a second spacer on the overcoat while forming the first spacer on the black matrix and at the position corresponding to the data line, and the second spacer is a post spacer.

11. A method for manufacturing a display panel, comprising the steps of the method for manufacturing the color filter display substrate according to claim 9.

12. A method for manufacturing a display panel, comprising the steps of the method for manufacturing the color filter display substrate according to claim 10.

13. The method according to claim 11, wherein the display panel further comprises an array substrate on which a second data line is formed, and a step of forming an electric field shielding member on the black matrix comprises:
forming the electric field shielding member on the black matrix and at a position corresponding to the second data line.

14. The color filter display substrate according to claim 2, wherein the first spacer is of a bar shape.

15. The color filter display substrate according to claim 2, wherein an overcoat is arranged on the black matrix and the color resin coatings, and the first spacer is arranged on the overcoat.

16. A method for manufacturing a color filter display substrate, comprising steps of:
forming a black matrix;
forming color resin coatings, the black matrix being arranged between two of the color resin coatings; and
forming an electric field shielding member on the black matrix, the electric field shielding member being configured to shield an electric field between adjacent pixel units,
wherein a data line are formed on a base substrate, and the step of forming the electric field shielding member on the black matrix comprises:
forming the electric field shielding member on the black matrix and at a position corresponding to the data line,
the step of forming the electric field shielding member on the black matrix and at a position corresponding to the data line comprises:
forming a first spacer on the black matrix and at a position corresponding to the data line,
prior to the step of forming the first spacer on the black matrix and at the position corresponding to the data line, the method further comprises:
forming an overcoat on the black matrix and the color resin coatings.

17. The method according to claim 16, wherein a Thin Film Transistor (TFT) is formed on the base substrate.

18. The method according to claim 17, wherein the step of forming the electric field shielding member on the black matrix and at a position corresponding to the data line further comprises:
after forming the first spacer on the black matrix and at the position corresponding to the data line, forming a conductive layer on a surface of the first spacer.

19. A method for manufacturing a display panel, comprising the steps of the method for manufacturing the color filter display substrate according to claim 16.

20. A method for manufacturing a display panel, comprising the steps of the method for manufacturing the color filter display substrate according to claim 17.

* * * * *